United States Patent [19]
Mina et al.

[11] Patent Number: 6,147,298
[45] Date of Patent: Nov. 14, 2000

[54] BREATHER ASSEMBLY FOR ELECTRICAL ENCLOSURES

[75] Inventors: Nabil L. Mina, Roselle; Richard Castillo, Chicago, both of Ill.

[73] Assignee: EGS Electrical Group LLC, Skokie, Ill.

[21] Appl. No.: 09/207,884

[22] Filed: Dec. 8, 1998

[51] Int. Cl.[7] ...................................................... H05K 5/00
[52] U.S. Cl. ........................ 174/17 VA; 174/58; 220/361; 220/367.1; 52/302.3; 429/89; 29/729
[58] Field of Search .................................. 174/17 VA, 48, 174/50, 58; 52/302.1, 302.3, 302.7, 209; 220/366.1, 367.1, 361; 429/89; 137/78.5; 29/592.1, 729

[56] References Cited

U.S. PATENT DOCUMENTS

| | | | |
|---|---|---|---|
| 3,724,706 | 4/1973 | Slocum | 220/3.8 |
| 4,135,540 | 1/1979 | Felsen | 137/78.5 |
| 4,304,233 | 12/1981 | Muriot | 220/361 |
| 4,689,281 | 8/1987 | Dandona et al. | 429/89 |
| 5,334,799 | 8/1994 | Naito et al. | 174/17 VA |
| 5,629,495 | 5/1997 | Sumida et al. | 174/12 R |
| 5,649,859 | 7/1997 | Shiga | 454/275 |
| 5,661,265 | 8/1997 | Yarbrough et al. | |
| 5,668,349 | 9/1997 | Durham et al. | 174/17 VA |
| 5,773,755 | 6/1998 | Iwatare | 174/17 VA |
| 5,822,934 | 10/1998 | O'Donnell | 52/209 |
| 5,932,839 | 8/1999 | Ren et al. | 174/175 F |

*Primary Examiner*—Dean A. Reichard
*Assistant Examiner*—Dhiru R Patel
*Attorney, Agent, or Firm*—Jones, Day, Reavis & Pogue

[57] ABSTRACT

A breather assembly having an outer housing, an insert in the upper portion of the housing, a porous metal disc adjacent the insert, a plurality of glass beads adjacent the disc, a spacer cup adjacent the beads and a washer acting as a plug adjacent the spacer cup. The housing has an upper closed end and a lower open end, the washer being press fitted into the open end to retain the cup, beads, disc and insert. There are two oppositely disposed openings in the housing which directly communicate to abutting converging openings in the spacer. The junction of the narrow end of the converging openings communicate with a central vertical opening, a space between the insert and the housing, a recess in the insert, another vertical opening in the insert which is spaced from the first vertical opening. The bottom end of the spaced vertical opening communicates with the porous metal disc. An air passage is created from the environment exterior to the housing through the converging openings, the central vertical opening, the space, the recess and the spaced vertical opening, the disc, the beads, around the cup and through the central opening of the washer. The converging openings provide for a Venturi effect which allows air to pass into and out of the breather apparatus but which prevents water from entering the enclosed electrical system.

11 Claims, 5 Drawing Sheets

BREATHER ASSEMBLY FOR ELECTRICAL ENCLOSURES

BACKGROUND OF THE INVENTION

1. Field of the Invention

The present invention relates to a vent or breather assembly, and more particularly, to an explosion proof breather assembly for electrical enclosures that is simply constructed and reliable.

2. Description of the Related Art

Water and moisture are the leading causes of corrosion and gradual deterioration of electrical components within an electrical enclosure. Enclosed electrical systems are frequently found in hostile environments. Examples of such hostile environments include ocean-going ships, cold climates and chemical factories. The primary function of a breather assembly is to provide adequate ventilation for the electrical system. Frequently a drain is also used with the enclosed system for allowing water that accumulates in the electrical system to be removed, while a breather assembly serves as a means to allow air to enter and exit the electrical enclosure. A major requirement for such a breather assembly is that it must preclude water from outside the breather assembly, such as rain or cleaning water, from entering the electrical system.

While the breather assembly serves as a means for air to move into and out of an enclosed electrical system, the assembly itself must also be explosion proof. If not, an explosion generated in one part of an electrical system may propagate through interconnected components of the system to another location and thus greatly enhance the spread of a fire.

There is a standard specification, referred to as NEMA 4X, that determines how well a breather assembly resists the entry of water into an electrical enclosure as well as its level of resistance to corrosion when exposed to a salt spray for 200 hours. To determine whether a design is water tight, it is subjected to a steady stream of water for five minutes from a hose positions from ten to twelve feet away. The hose has a one inch nozzle and delivers water at a 65 gallons per minute rate. Present breather assemblies which claim to have a NEMA 4X rating frequently fail the relevant specification. The need, therefore, for a true NEMA 4X rated breather assembly is very important.

BRIEF DESCRIPTION OF THE INVENTION

The present invention overcomes the shortcomings of the related art. What is disclosed here is a breather apparatus for an enclosed electrical system comprising a housing having an exterior surface, an interior chamber and first and second end portions, the first end portion being open and the second end portion being closed, an air passageway system within the interior chamber including a first opening, a second opening generally parallel to the first opening and in communication therewith, a converging opening disposed generally perpendicular to the first opening and in communication therewith, the wider end of the converging opening being in communication with the exterior surface of said housing and the narrow end of the converging opening being located adjacent the first opening, and a third opening disposed generally perpendicular to the first opening and extending away from the narrow end of the converging opening and terminating at the exterior surface whereby a passageway is formed through the housing from one region on the exterior surface to another region on the exterior surface and the passageway extends from the regions of the exterior surface through the first opening and the second opening to the first end portion of the housing.

An object of the present invention is to provide a breather assembly that is simply constructed and reliable. Another aim of the present invention is to provide a breather assembly that is resistant to flame propagation. A further advantage of the present invention is to provide a breather assembly that is resistant to the passage of water or moisture. Yet a further aspect of the present invention is to provide a breather assembly that allows air to enter and exist an enclosed electrical system to which the breather assembly is attached. A still further object of the present invention is to provide a breather assembly that is efficient and automatic in operation.

A more complete understanding of the present invention and its objects, aspects, aims and advantages thereof will be gained from a consideration of the following description of the preferred embodiment read in conjunction with the accompany drawings provided therein.

BRIEF DESCRIPTION OF THE SEVERAL VIEW OF THE DRAWINGS

DESCRIPTION OF THE PREFERRED EMBODIMENT

Figure 1:
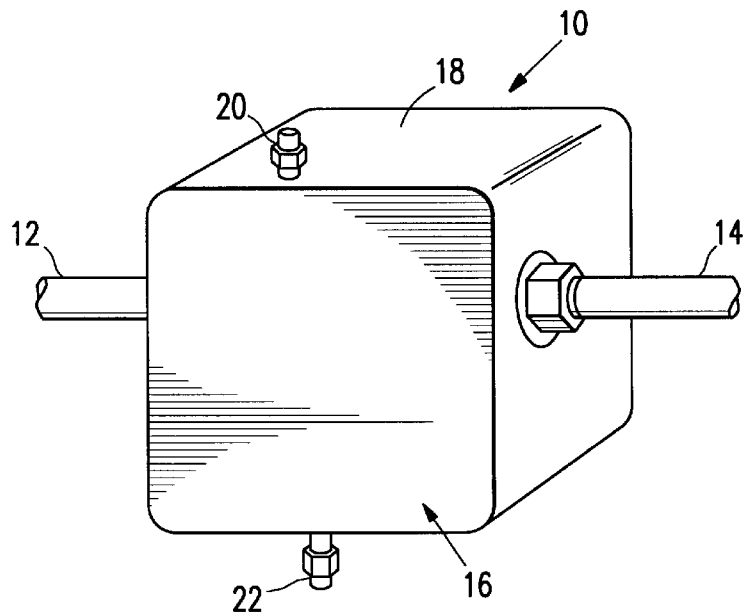
FIG. 1 is a perspective, diagrammatic view of a portion of an enclosed electrical system illustrating a breather assembly and a drain assembly.

While the present invention is open to various modifications and alternative constructions, the preferred embodiment shown in the drawings will be described herein in detail. It is understood, however, that there is no intention to limit the invention to the particular form disclosed. On the contrary, the intention is to cover all modifications, equivalent structures and methods, and alternative constructions falling within the spirit and scope of the invention as expressed in the appended claims.

Referring now to FIG. 1, there is illustrated a portion of an enclosed electrical system 10. The portion includes electrical conduits 12 and 14 connected to a junction box 16. On an upper surface 18 of the junction box is a breather assembly 20. Connected to a bottom surface of the junction box is a drain 22, such as the drain disclosed in U.S. Pat. 5,661,265 and incorporated herein by reference. As can be appreciated, the electrical components and the wires within the enclosed electrical system are protected from the environment in which the system resides by such elements as metal conduits and junction boxes.

The purpose of the drain 22 is to allow any condensation which forms within the electrical enclosure to be drained away to the outside of the enclosure. By the same token, the breather assembly 20 is used to allow ventilation. That is, air may enter and exit the enclosure without serious impediment. In both cases, the breather assembly and the drain assembly are constructed so that water will not enter the enclosure even under such adverse conditions as when the junction box is sprayed with high pressure water during a cleaning process.

Figure 2:
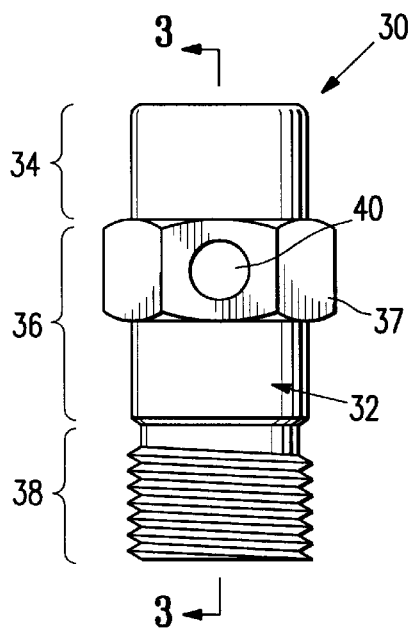
FIG. 2 is a front elevation view of a housing of a breather assembly.
Figure 3:
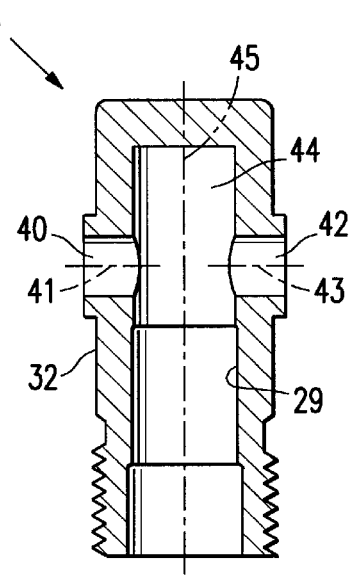
FIG. 3 is a sectional elevation view of the housing taken along line 3—3 of FIG. 2.
Figure 4:
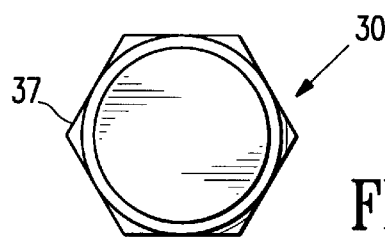
FIG. 4 is a top plan view of the housing shown in FIGS. 2 and 3.
Figure 5:
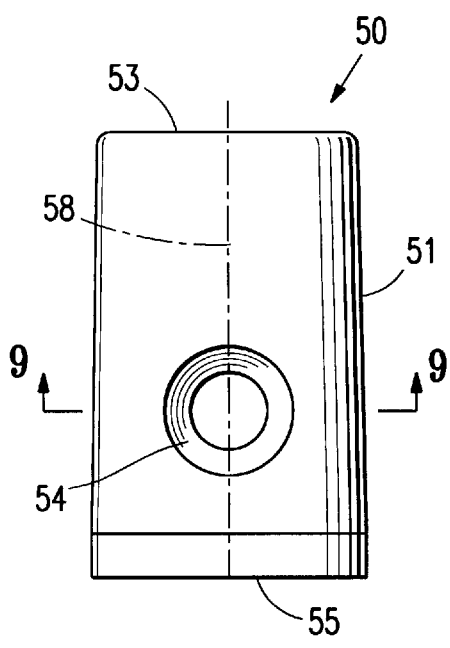
FIG. 5 is a front elevation view of an insert that is placed in the housing illustrated in FIGS. 2–4.
Figure 8:
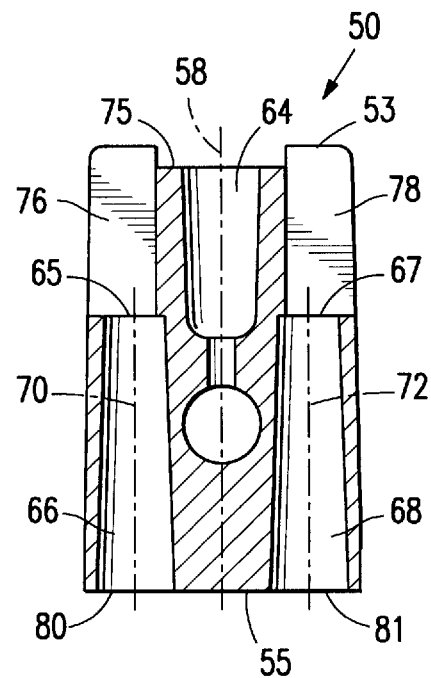
FIG. 8 is a sectional elevation view taken along line 8—8 of FIG. 6.
Figure 6:
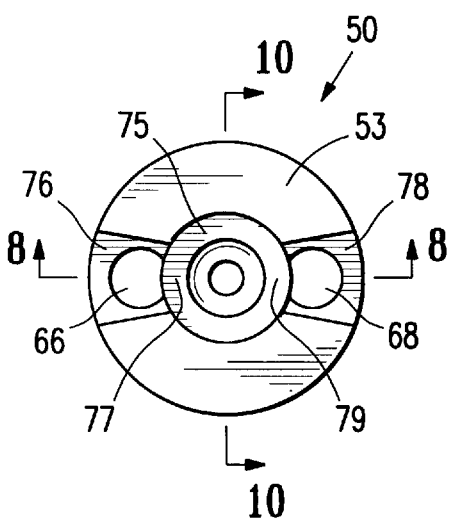
FIG. 6 is a top plan view of the insert shown in FIG. 5.
Figure 7:
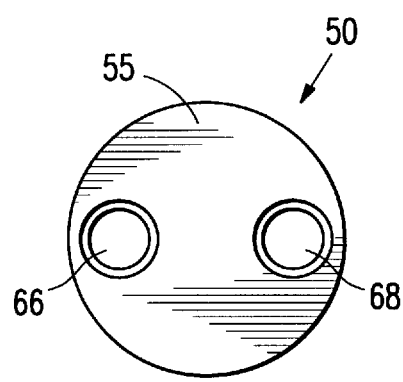
FIG. 7 is a bottom plan view of the insert shown in FIGS. 5 and 6.
Figure 9:
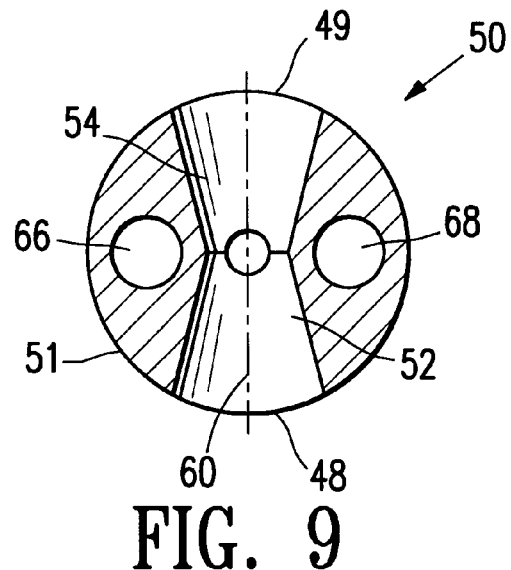
FIG. 9 is a sectional plan view taken along line 9—9 of FIG. 5.

Referring now to FIGS. 2, 3 and 4, there is illustrated a housing 30 of the breather assembly having an external surface 32, an upper portion 34, a middle portion 36 and a bottom portion 38. The upper portion 34 is enclosed at its end and may be integral with the middle and bottom portions or the end may be capped. The bottom portion 38 has standard external screw thread to allow the breather assembly to be threadingly engaged with the enclosed electrical system as shown in FIG. 1. The middle portion 36 includes a nut-like construction 37 having six faces which may be engaged by a wrench in a standard fashion to tighten the engagement between the breather assembly and the junction box. The middle portion also includes two openings, a first opening 40 and a second opening 42. These communicate the external surface and the environment external to the housing with an elongated internal central chamber 44.

The first and second openings are shown formed in a respective face of the nut-like construction 37. Also, the openings are shown to have longitudinal axes, represented by phantom lines 41 and 43 generally perpendicular to a longitudinal axis of the central chamber represented by phantom line 45. The chamber is surrounded by an internal wall 29. The top, middle and lower portions of the housing may be integral as shown and may be formed of stainless steel, type 303. Dimensionally, the housing is approximately 2 inches long and about 0.875 inches in diameter. This dimension is the same as the width of the housing when viewed in FIG. 4. The threaded bottom portion is approximately 0.80 inches in length, the middle portion is about 0.70 inches and the upper portion is approximately 0.472 inches. The chamber 44 may be approximately 1.8 inches long and have an inner diameter of about 0.48 inches.

Figure 10:
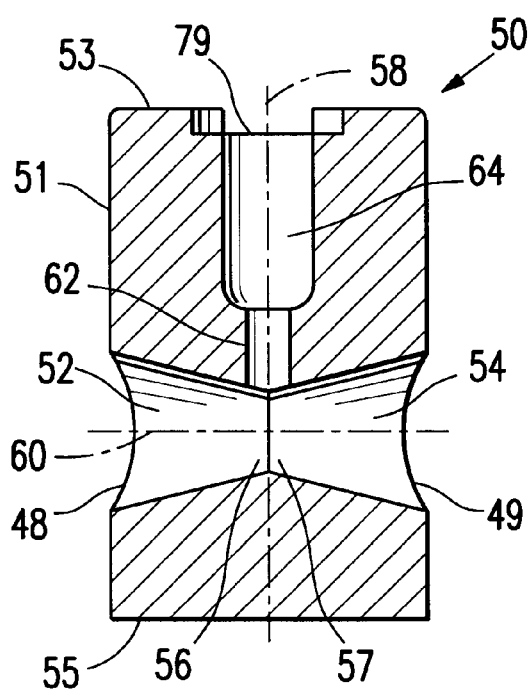
FIG. 10 is a sectional elevation view taken along line 10—10 of FIG. 6.

To appreciate the simple construction here, reference is made now to FIGS. 5–10 where a special insert 50 is illustrated. The special insert is generally cylindrical in shape and has several interconnected openings through which air is allowed to flow. More specifically, the insert has an outer surface 51, a top end 53 and a bottom end 55. There is a first converging or frusto-conical opening 52 and an adjoining second converging or frusto-conical opening 54. These converging openings communicate with each other and have their wider ends 48, 49 at the outer surface 51 of the insert and their narrow ends 56, 57 joined at the longitudinal axis of the insert as represented by the phantom line 58. As shown in FIG. 10, the converging openings have a longitudinal axes in a horizontal direction, represented by the phantom line 60. Positioned at the intersection or junction of the narrow ends of the converging openings is a vertically disposed opening 62. This opening expands into a larger opening 64 which is also vertically disposed. Formed offset from the longitudinal axis 58 of the insert are two longitudinally (vertically) directed openings 66 and 68. The longitudinal axes 70, 72 of these openings are generally perpendicular to the longitudinal axis 60 of the converging openings.

The converging openings have an angular convergence of about 28 degrees. The length of the insert is approximately 0.775 inches and the diameter is approximately 0.490 inches. The insert may have a slight taper when moving from the bottom surface 55 to the top surface 53. The openings 66 and 68 may also be tapered. The insert may be made of any suitable material, such as a synthetic resin. A good example is DuPont ZYTOL 101.

The openings 66 and 68 extend for approximately 0.460 inches or slightly more than half the distance of the longitudinal dimension of the insert. Between upper ends 65, 67 of the openings 66 and 68 and the top end 53, there are recesses 76 and 78, respectively, which may best be seen in FIGS. 6 and 8. At the top of the recesses there are two spaces 77, 79 created between the top end 53 of the insert and a surface 75 around the upper end of the opening 64. The spaces are formed because the surface 75 does not extend as high as the top end. It can now be appreciated that there is a passageway from the bottom end 55 of the insert to the external surface 51 through the special insert. This passageway begins at bottom ends 80, 81 of the openings 66 and 68, located at the bottom end 55 of the insert, extends upwardly along the openings 66 and 68 and the recesses 76 and 78, moves through the spaces 77, 79, and then downwardly through the central vertical openings 62, 64 to the two converging openings 52 and 54. As will be explained hereinbelow, this passageway is used to facilitate the movement of air into and out of the enclosed electrical system but, because of its construction, will prevent water from passing into the system.

Attention is now directed to the two converging openings 52 and 54. It may be appreciated that a fluid flowing through the converging openings in a horizontal direction, when viewing the openings in FIG. 10, will create a Venturi effect at the narrow ends 56, 57 of the openings at the junction with the opening 62. According to the Bernoulli equation a low pressure will be developed at this junction so as to create a movement of fluid in the passageway towards the junction and then along the converging openings in the direction of flow and away from the junction. This will happen rather than having fluid move upwardly through the openings 62, 64. Thus, if water is passing through the converging openings 52 and 54 in a direction parallel to the longitudinal axis 60, the low pressure created at the junction will cause a movement of fluid along the passageway to the converging openings and away from the insert.

Figure 11:
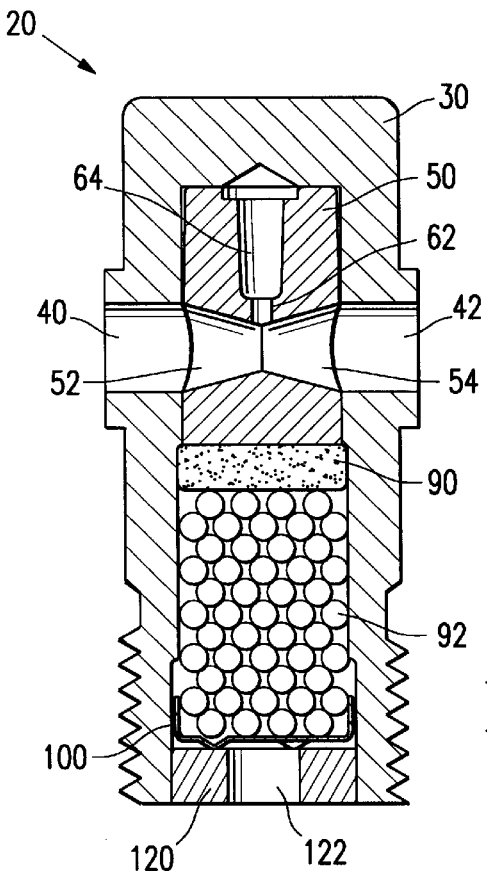
FIG. 11 is a side sectional elevation view of the breather assembly of the present invention.
Figure 12:
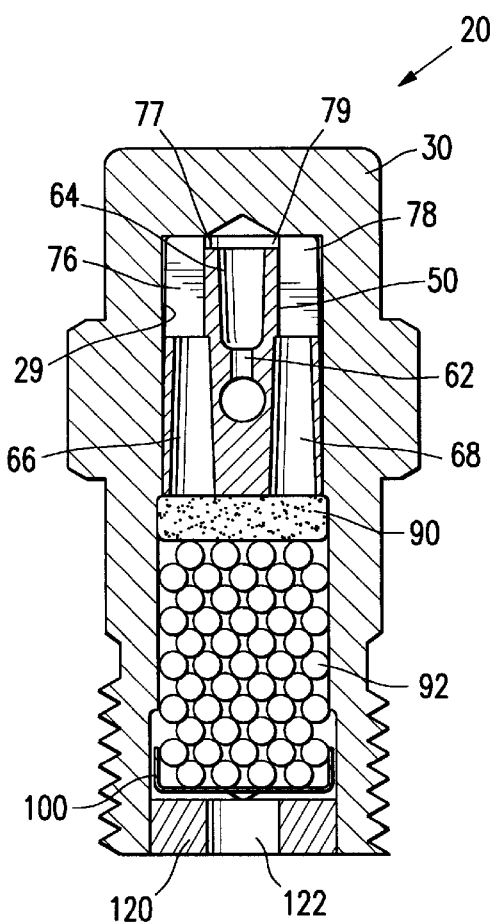
FIG. 12 is a front sectional elevation view of the breather assembly of the present invention.

Reference is now made to FIGS. 11 and 12 which show the breather assembly 20 in its completed form. The housing 30 and the insert 50 have already been described. As can be seen, the insert occupies the upper portion and a part of the middle portion of the housing. The insert is fitted into the chamber 44 and against the interior wall 29. Also the converging openings 52, 54 of the insert align with the openings 40, 42 in the housing. Thus, there is communication for air from outside breather assembly to the interior of the breather assembly.

Positioned beneath the special insert 50 is a porous metal disc 90. A preferred material for the disc is stainless steel.

The disc has a diameter of about 0.50 inches and a thickness or height of about 0.125 inches. The disc may be purchased from Mott Metalurgical Corp. of Farmington, Conn. Two levels of porosity may be used, 40 micron and 100 micron. As can be appreciated, the porous metal disc will allow air to pass through, but will retard liquid and flames. The porous metal disc will also tend to dissipate the energy of an explosion.

Beneath the porous metal disc are a plurality of glass beads 92 which fill a substantial part of the remainder of the middle portion and of the lower portion of the housing. A preferable glass bead has a diameter of about 0.08 inches and may be purchased from the Agsco Corporation of Wheeling, Ill. The glass beads also provide a passageway for air, but will retard the flow of a liquid and the propagation of a flame. The beads will also act to dissipate the energy of an explosion.

Figure 13:
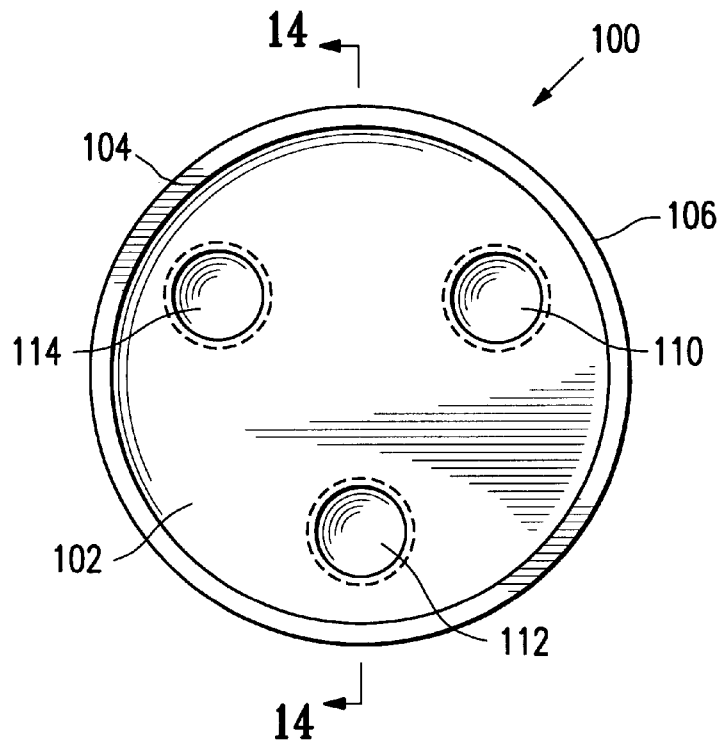
FIG. 13 is an enlarged top plan view of a spacer cup which is part of the breather assembly shown in FIGS. 11 and 12.
Figure 14:
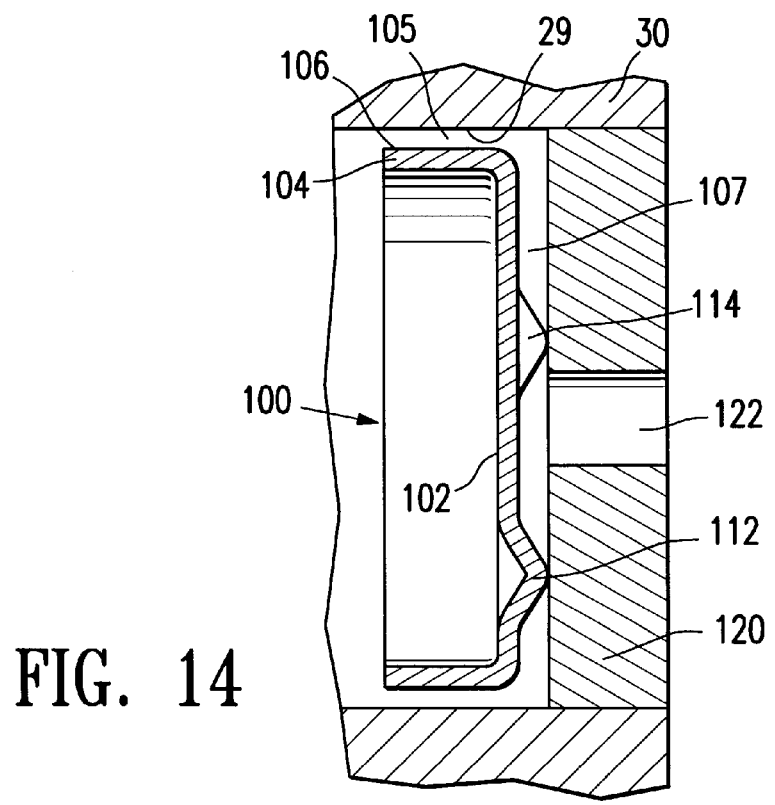
FIG. 14 is a sectional elevation view taken along line 14—14 of FIG. 13.

Beneath the glass beads is a spacer cup 100 which is shown in detail in FIGS. 13 and 14. The spacer cup includes a base 102 and a cylindrical side wall 104. The cup is preferably made of stainless steel, type 300, having a diameter of approximately 0.520 inches. The wall 104 has an outer surface 106 which when placed in the chamber 44 of the housing 30 leaves a ring-shaped space 105 of approximately 10 mils, or 0.010 inches between itself and the interior wall 29 of the housing 30.

The cup also has three dimples 110, 112 and 114 which function to space the cup from a washer 120, FIGS. 11 and 12. The height of the dimple may be about 0.030 inches. The ring-shaped space 105 and the space 107 between the base 102 of the cup and the washer allow air to move around the cup. The washer is pressed fitted to the interior wall 29 of the housing so as to complete the assembly and support the special insert, the porous metal disc, the glass beads and the spacer cup. The pressed washer may be of nylon and may have an outer diameter of about 0.540 inches, a central opening 122 of about 0.203 inches in diameter and a thickness of about 0.157 inches.

It is now evident that a complete air passageway exist between the exterior of the breather assembly represented by the exterior surface 32 of the housing and the interior of an enclosed electrical system which is in communication with the breather assembly through the opening 122 of the washer when the breather assembly is threadedly engaged with the electrical system, such as shown in FIG. 1.

In operation, air may flow into and out of the enclosed electrical system along a path from the openings 40, 42 in the housing, through the converging openings 52, 54 in the special insert, and the openings 62, 64, the spaces 77, 79, the recesses 76, 78 and the openings 66, 68. These openings, spaces and recesses are either in the special insert or between the special insert and the interior wall 29 of the housing. The air passageway continues through the porous metal disc 90, through the glass beads 92, through the space 105 between the wall of the cup and the interior wall 29 of the housing, through the space 107 between the cup 102 and the washer 120 and finally through the central opening 122 in the washer. While air may flow into and out of the enclosed electrical system, water is prevented from entry by the Venturi effect explained above. Furthermore, flame propagation is retarded by the beads, the cup, the washer and the porous metal disc, and energy from a exposition is also dissipated by the beads, the disc, the cup and the washer.

The specification describes in detail an embodiment of the present invention. Other modifications and variations will, under the doctrine of equivalents, come within the scope of the appended claims. For example, a breather assembly may have sand instead of glass beads, or a different design may be used for the cup, or different dimensions may be used for the housing or the special insert. These are all considered equivalent structures. Also making geometric modifications to the housing, the special insert or the cup, for example, are also considered equivalent structures. Still other alternatives will also be equivalent as will many new technologies. There is no desire or intention here to limit in any way the application of the doctrine of equivalents.

What is claimed is:

1. A breather apparatus for an enclosed electrical system comprising:
    a housing having an exterior surface and first and second end portions, said first end portion being open and said second end portion being closed; and
    means located within said housing for forming an air passageway system including:
        a first opening located within said air passageway means disposed in a first direction;
        a second opening also disposed generally in said first direction but offset from said first opening and in communication therewith;
        a first converging opening disposed in a second direction in direct communication with said first opening and not with said second opening, a wider end of said converging opening communicating with said exterior surface of said housing and a narrow end of said converging opening being disposed at said first opening;
        a third opening disposed generally in said second direction and extending away from said narrow end of said converging opening and terminating at said exterior surface whereby a passageway is formed through said housing from one region on the exterior surface to another region on the exterior surface, and said passageway also extends from said regions of the exterior surface through said first opening and said second opening to said first end portion of said housing.

2. An apparatus as claimed in claim 1 wherein:
    said third opening is a second converging opening having a wider end in communication with one of said exterior surface regions and a narrow end that abuts said narrow end of said first converging opening.

3. An apparatus as claimed in claim 2 wherein:
    said first and said second converging openings are disposed in a generally horizontal direction and said first and said second openings are generally perpendicular thereto.

4. An apparatus as claimed in claim 3 wherein:
    said housing has an interior chamber; and including:
        an insert mounted in said chamber, said insert having said first and said second openings, said first converging opening and said second converging opening.

5. An apparatus as claimed in claim 4 including:
    a space between said first opening and said second opening.

6. An apparatus as claimed in claim 1 including:
    a screw thread formed in the exterior surface of said housing at said first end portion.

7. An apparatus is claimed in claim 1 wherein:
    said housing has an interior chamber and including:
        an insert mounted in said chamber, said insert having said first and said second openings, and said converging opening.

8. A breather apparatus for an enclosed electrical system comprising:
- a housing having an exterior surface and first and second end portions, said first end portion being opened and said second end portion being closed;
- said housing having a central chamber;
- oppositely disposed openings in said housing communicating said external surface with said chamber;
- an insert in said chamber, said insert having two converging openings where each wide portion of said converging openings are in communication with respective ones of said housing openings;
- a first generally longitudinally directed opening in said insert forming a junction with narrow ends of said converging openings;
- a lateral space in communication with said first longitudinal opening;
- a second generally longitudinally directed opening spaced from said first longitudinal opening;
- a porous metal disc positioned in said chamber between said insert and said first open end portion of said housing;
- a plurality of small closely packed objects positioned between said insert and said first opened end portion of said housing;
- a restraining spacer positioned adjacent said small closely packed objects; and
- a washer partially enclosing said open first end portion of said housing whereby an air passageway is formed in said chamber between said open first end portion of said housing and said oppositely disposed openings through said housing.

9. A method for forming a breather apparatus for an enclosed electrical system comprising the steps of:
- forming a housing having an air passageway for communicating with an enclosed electrical system;
- forming a converging opening in said housing as part of said air passageway, said converging opening for creating a low pressure to prevent liquid from an environment external to said apparatus from entering said enclosed electrical system through said air passageway; and
- forming an insert for said apparatus, said insert having said converging opening disposed in one direction and a second opening disposed in a generally perpendicular direction relative to said converging opening, said second opening meeting said converging opening at a junction including a narrow end of said converging opening.

10. A method as claimed in claim 9 wherein:
said insert includes a third opening disposed generally parallel to said second opening and spaced therefrom.

11. A method as claimed in claim 9 including the steps of:
forming a barrier to flame propagation and not to air movement in said apparatus.

* * * * *